US000001041H

United States Statutory Invention Registration [19]

[11] Reg. Number: H1041

[43] Published: Apr. 7, 1992

Lux et al.

[54] METHOD OF REDUCING THE SURFACE LEAKAGE ON A III-V SEMICONDUCTOR

[75] Inventors: Robert A. Lux, Toms River; Ravi Khanna, Somerset, both of N.J.

[73] Assignee: The United States of America as represented by the Secretary of the Army, Washington, D.C.

[21] Appl. No.: 687,604

[22] Filed: Apr. 15, 1991

[51] Int. Cl.[5] ..... H01L 21/00

[52] U.S. Cl. ..... 437/235; 437/228; 148/33.3

[58] Field of Search ..... 436/225, 228; 148/33.3

[56] References Cited

U.S. PATENT DOCUMENTS 5,021,365 6/1991 Kirchner et al. ..... 437/225

FOREIGN PATENT DOCUMENTS 2529384 12/1983 France .

*Primary Examiner*—John S. Maples
*Assistant Examiner*—C. Sayala
*Attorney, Agent, or Firm*—Michael Zelenka; Roy E. Gordon

[57] ABSTRACT

The surface leakage on a III-V semiconductor is reduced by selectively growing a mixed oxide on the surface of the semiconductor to passivate the semiconductor and reduce the surface leakage.

6 Claims, No Drawings

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD OF REDUCING THE SURFACE LEAKAGE ON A III-V SEMICONDUCTOR

GOVERNMENT INTEREST

The invention described herein may be manufactured, used, and licensed by or for the Government for governmental purposes without the payment to us of any royalty thereon.

FIELD OF INVENTION

This invention relates in general to a method of reducing the surface leakage on a III-V semiconductor and in particular to such a method where the III-V semiconductor is a gallium arsenide field effect transistor FET.

BACKGROUND OF THE INVENTION

Gate leakage and gate to drain breakdown impose several constraints on the operation of GaAs FET's. In particular, maximum power gain of high frequency power transistors is limited by these quantities. The majority of techniques for extending these limits have involved design modifications of the FET such as locating the FET gate as far from the drain as is possible while maintaining good high frequency characteristics.

SUMMARY OF THE INVENTION

The general object of this invention is to provide a method of reducing the surface leakage on a III-V semiconductor. A more particular object of the invention is to provide such a method that will reduce the gate leakage and increase the gate to drain breakdown voltage of GaAs FET's. A still further object of the invention is to provide such a method in which there will be no design constraints placed on the FET. Another object of the invention is to provide such a method that is simple to implement.

It has now been found that the aforementioned objects can be attained by selectively growing an oxide on the semiconductor surface that passivates the semiconductor surface and reduces the surface leakage.

In the instance when GaAs is the semiconductor, $Ga_2O_3$ is selectively grown on the GaAs surface. GaAs can be oxidized by various oxidants forming a mixed gallium-arsenic oxide. This oxide has very poor electrical properties. Our desirable method forms the mixed oxide by photo oxidation in water. In pH neutral water, the arsenic oxide selectively dissolves leaving a gallium oxide. Auger and RBS analysis shows the oxide to be $Ga_2O_3$. This oxide passivates the GaAs surface and reduces the surface leakage. The amount of oxide required is only enough to give good coverage of the surface. Hence, there is very little etching of the GaAs during oxidation.

DESCRIPTION OF THE PREFERRED EMBODIMENT

The GaAs FET to be treated is placed in a container of deionized water. The immersed FET is illuminated with lamp light. The FET is removed when sufficient oxide has grown to effect the desired improvement of gate leakage and breakdown voltage, typically about 15 minutes. For a fixed voltage, there is an order of magnitude reduction in gate leakage.

The aforesaid method of reducing gate leakage and increasing gate to drain breakdown voltage utilizes a post-fabrication surface treatment in contrast to imposing design constraints on the FET.

There are no design constraints on the FET according to the method of the invention. Moreover, the method is exceedingly simple to implement in that a light source and deionized water are the only equipment needed. Then too, the device to be treated needs no prior preparation. Also, the method is quick, typically requiring less than 30 minutes to complete.

The method of the invention may be used whenever it is desired to reduce surface leakage on any GaAs semiconductor device. The most immediate application is to GaAs microwave FET's for both commercial and military use.

We wish it to be understood that we do not desire to be limited to the exact details of construction shown and described for obvious modifications will occur to a person skilled in the art.

What is claimed is:

1. Method of reducing the surface leakage on a III-V semiconductor comprising selectively growing a mixed oxide on the surface of the semiconductor to passivate the semiconductor and reduce the surface leakage.

2. Method according to claim 1 wherein the III-V semiconductor is a GaAs semiconductor.

3. Method of reducing the gate leakage and increasing the breakdown voltage of a GaAs field effect transistor (FET) comprising forming a mixed oxide by photo oxidation in water to passivate the surface of the GaAs and reduce the surface leakage.

4. Method according to claim 3 wherein the water is a pH neutral water in which arsenic oxide selectively dissolves leaving a gallium oxide $Ga_2O_3$ that passivates the GaAs surface and reduces the surface leakage.

5. Method of reducing the gate leakage and increasing the breakdown voltage of a GaAs FET comprising immersing the FET in a container of deionized water and illuminating with a lamp and then removing the FET when sufficient oxide had grown to effect the desired improvement of gate leakage and breakdown voltage.

6. Method according to claim 5 wherein the method requires less than 30 minutes to complete.

* * * * *